(12) United States Patent
Gravad et al.

(10) Patent No.: US 12,171,058 B2
(45) Date of Patent: Dec. 17, 2024

(54) PRINTED CIRCUIT BOARD (PCB) MODULE COMPRISING AN EMBEDDED RADIO-FREQUENCY SEMICONDUCTOR DIE

(71) Applicant: GN Hearing A/S, Ballerup (DK)

(72) Inventors: Maja Amskov Gravad, Copenhagen (DK); Søren Christian Ell, Roskilde (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 17/549,851

(22) PCT Filed: Jun. 17, 2020

(86) PCT No.: PCT/EP2020/066700
§ 371 (c)(1),
(2) Date: Dec. 13, 2021

(87) PCT Pub. No.: WO2020/254362
PCT Pub. Date: Dec. 24, 2020

(65) Prior Publication Data
US 2024/0015882 A1     Jan. 11, 2024

(30) Foreign Application Priority Data
Jun. 18, 2019   (EP) .................................. 19180726

(51) Int. Cl.
*H05K 1/02*   (2006.01)
*H01Q 1/22*   (2006.01)
(Continued)

(52) U.S. Cl.
CPC ......... *H05K 1/0243* (2013.01); *H01Q 1/2283* (2013.01); *H01Q 1/38* (2013.01);
(Continued)

(58) Field of Classification Search
CPC ...... H05K 1/0243; H05K 1/181; H05K 1/185; H05K 2201/10098; H01Q 1/2283; H01Q 1/38
(Continued)

(56) References Cited

U.S. PATENT DOCUMENTS 8,310,837 B2 * 11/2012 Kawano ................... H04B 3/56
361/780
2008/0117609 A1   5/2008 Itou et al.
(Continued)

FOREIGN PATENT DOCUMENTS

EP         2919487         9/2015
WO   WO 2017/078709    5/2017

OTHER PUBLICATIONS

European Search Report for EP Patent Appln. No. 19180726.2 dated Nov. 28, 2019.
(Continued)

*Primary Examiner* — Binh B Tran
(74) *Attorney, Agent, or Firm* — Vista IP Law Group, LLP

(57) ABSTRACT

A printed circuit board (PCB) module comprising a unitarily formed multilayer PCB, where the multilayer PCB comprises a plurality of layers, the plurality of layers comprising interleaved conductive and non-conductive layers, a first outer surface and an opposing second outer surface, the first outer surface comprising one or more components, the second outer surface comprising one or more electrical contacts such as solder bumps, and a first embedded semiconductor die having an active side facing the first outer surface, wherein the first embedded semiconductor die comprises a wireless radio-frequency transceiver such as a Bluetooth-compliant transceiver.

16 Claims, 4 Drawing Sheets

(51) Int. Cl.
*H01Q 1/38* (2006.01)
*H05K 1/18* (2006.01)

(52) U.S. Cl.
CPC ............. *H05K 1/181* (2013.01); *H05K 1/185* (2013.01); *H05K 2201/10098* (2013.01)

(58) Field of Classification Search
USPC ..................................................... 361/700 R
See application file for complete search history.

(56) References Cited

U.S. PATENT DOCUMENTS

| | | |
|---|---|---|
| 2011/0147920 A1 | 6/2011 | Choudhury et al. |
| 2014/0035154 A1 | 2/2014 | Geitner et al. |
| 2014/0264737 A1 | 9/2014 | Gouchi |
| 2018/0025986 A1* | 1/2018 | Chiu ................... H01L 23/3114 257/531 |
| 2018/0098162 A1* | 4/2018 | Vang ................... H04R 25/609 |
| 2020/0144723 A1* | 5/2020 | Augustin ................ H01L 24/85 |
| 2020/0185299 A1* | 6/2020 | Chang ..................... H01L 23/13 |

OTHER PUBLICATIONS

PCT International Search Report and Written Opinion for International Appln. No. PCT/EP2020/066700 dated Aug. 5, 2020.
Foreign OA for CN Patent Appln. No. 202080056218.2 dated Oct. 18, 2024.

* cited by examiner

PRINTED CIRCUIT BOARD (PCB) MODULE COMPRISING AN EMBEDDED RADIO-FREQUENCY SEMICONDUCTOR DIE

RELATED APPLICATION DATA

This application is a national stage of International Patent Application No. PCT/EP2020/066700 filed on Jun. 17, 2020, which claims priority to, and the benefit of, European Patent Application No. 19180726.2 filed on Jun. 18, 2019. The entire disclosures of the above-identified applications are expressly incorporated by reference herein.

FIELD

The present disclosure relates to a printed circuit board (PCB) module having one or more embedded radio-frequency transceivers and a head-wearable hearing device having such a PCB module.

BACKGROUND

For compact communication devices such as head-wearable hearing devices, including hearing aids, a challenging aspect is the size of the individual parts and components that make up the device. Making compact printed circuit board (PCB) modules suitable for use in such compact communication devices poses a number of challenges as the electronic components, connected by a complex network of electric traces and pads, become ever smaller and are placed closely together.

Some types of radio-frequency transceivers such as Bluetooth®-compliant transceivers comprise an antenna coil, which is sensitive to signal attenuation and/or interference from nearby conductive materials like conductive traces and wires. The integration of such radio-frequency transceivers in the printed circuit board (PCB) modules must therefore take this constraint into consideration. Traditionally, radio-frequency transceivers for head-wearable hearing devices are integrated on semiconductor chips or dies configured as a so-called flip chip. The flip chip is a semiconductor die which comprises a plurality of peripherally arranged conductive solder bumps for connecting the semiconductor die to correspondingly arranged conductive pads on a PCB. Thus, when appropriately mounted the active side of the flip chip faces the surface of the PCB such that the radio-frequency transceiver "looks" into the PCB. To shield the antenna coil no electrically conductive materials should be present within a so-called keep-out area on the active side of the flip chip as well as in a keep-out volume extending outward from the keep-out area.

For a traditional surface mounted radio chip, part of the PCB, which is made from dielectric substrate materials such as polyimide, will be within the keep-out volume and no electric traces can be placed in the PCB within the keep-out volume.

Very thin components, <100 microns thick, may be embedded within the layers of a multilayer PCB module, which allows for greater flexibility in allocating components and may help reduce size of the PCB module. However, radio-frequency transceiver dies or chips have been considered unsuited for being embedded partly due to their thickness and their requirements for a keep-out volume.

SUMMARY

An object is to provide a printed circuit board (PCB) module comprising a multilayer PCB having an embedded radio-frequency transceiver. The active side of the embedded radio-frequency transceiver faces towards a first outer surface of the multilayer PCB. This first outer surface has a number of components on it and opposes the second outer surface on which a number of electrical contacts such as solder bumps are located.

By embedding the radio-frequency transceiver in the way described above the PCB module may achieve a smaller form factor, better protection of the vulnerable semiconductor die and greater flexibility in overall design by removing the surface area consuming semiconductor die holding the radio-frequency transceiver from an outer surface of the multilayer PCB and pushing the semiconductor die into the inner layers of the multilayer PCB.

In view of the above mentioned objects, a printed circuit board (PCB) module comprising a unitarily formed multilayer PCB is disclosed. The multilayer PCB comprises:
  a plurality of layers, the plurality of layers comprising interleaved conductive and non-conductive layers;
  a first outer surface and an opposing second outer surface, the first outer surface comprising one or more electrical components such as resistors, capacitors, or inductors, the second outer surface comprising one or more electrical contacts such as solder bump(s);
  a first embedded semiconductor die having an active side facing the first outer surface;
  wherein the first embedded semiconductor die comprises a wireless radio-frequency transceiver such as a Bluetooth-compliant transceiver.

By unitarily formed is meant that the multilayer PCB is manufactured so as to constitute a unit. That is, it may be assembled from individual layers and parts during manufacture, but after manufacture, the individual layers and parts are bonded together and cannot be disassembled without destroying the individual components.

By interleaved conductive and non-conductive layers is meant the alternating layers of conductive material, usually copper, and non-conductive material, usually a dielectric substrate, which are laminated together to form part of a PCB.

By components is meant any of a multitude of possible electronic components such as resistors, capacitors, inductors, semiconductors etc. attachable to a surface of PCB via e.g. soldering or glueing.

The active side of the first embedded semiconductor die is the side having connection pads.

The first and second outer surfaces may be, and usually are, substantially parallel.

In an embodiment, the multilayer PCB comprises a keep-out volume arranged between the first outer surface and the active side of the first embedded semiconductor die. The keep-out volume is delimited by a keep-out area of the active side of the first embedded semiconductor die and a keep-out height extending from the keep-out area towards the first outer surface. The keep-out volume is free from electrically conductive materials such as electrical traces, wires, through-holes and areas.

The keep-out volume may have any shape that can be said to be bounded by an area and can be further characterized by a height extending orthogonally from that area such as e.g. a rectangular cuboid, frustrum, or a more complex shape. The keep-out height may be the distance between the first outer surface and the active side of the first embedded semiconductor die, but may also have a size smaller or larger than the distance between the first outer surface and the active side of the first embedded semiconductor die.

In an embodiment, the active side of the first embedded semiconductor die comprises an antenna coil, and the keep-out area at least comprises the antenna coil.

By the keep-out area comprising the antenna coil is meant that the extend of the keep-out area is similar to the extend of the antenna coil or larger.

The keep-out height may be at least 100 microns (µm), preferably at least 150 microns, most preferably at least 160 microns.

In an embodiment, the multilayer PCB further comprises a second embedded semiconductor die having an active side facing the first or second outer surface of the multilayer PCB, and the second embedded semiconductor die comprises a wireless radio-frequency transceiver such as a magnetoinductive transceiver.

In an embodiment, the first and second embedded semiconductor dies or circuits are arranged in a back-to-back configuration separated by at least one intervening layer of the plurality of layers and the intervening layer optionally being a conductive layer or shield.

By a back-to-back configuration is meant that the embedded semiconductor dice are arranged with their non-active sides/passive sides facing towards each other and that the embedded semiconductor dice are positioned such that they, with respect to their length and width, partially overlap in their position when viewed along an axis extending substantially orthogonally from the second outer surface. By non-active side of a semiconductor die is meant the side opposing the active side.

The intervening conductive layer or shield acts to shield electromagnetic interference (EMI) between the embedded semiconductor dies and is also known as EMI shielding.

In an embodiment, the first embedded semiconductor die has a thickness less than 200 microns, for instance less than 150 microns or less than 90 microns.

The thickness of a semiconductor die is generally a well-defined dimension and is usually shorter than the length and width of the semiconductor die.

In an embodiment, the active side of the first embedded semiconductor die comprises a plurality of electrical pads connected to respective electric traces formed in one or more conductive layers of the multilayer PCB.

Electric traces (also called tracks) and connection pads are customary features of PCBs. Being connected to respective electric traces means that the electronic pads are connected to relevant electric traces using standard methods.

In an embodiment, the active side of the first embedded semiconductor die is electrically connected via the plurality of electrical pads and respective electric traces to at least one of the one or more electrical components on the first outer surface of the multilayer PCB.

In another aspect, a head-wearable hearing device adapted for use in, or at, an ear of a user is disclosed. The head-wearable hearing device comprises a printed circuit board (PCB) module as described above.

DETAILED DESCRIPTION

Figure 1:
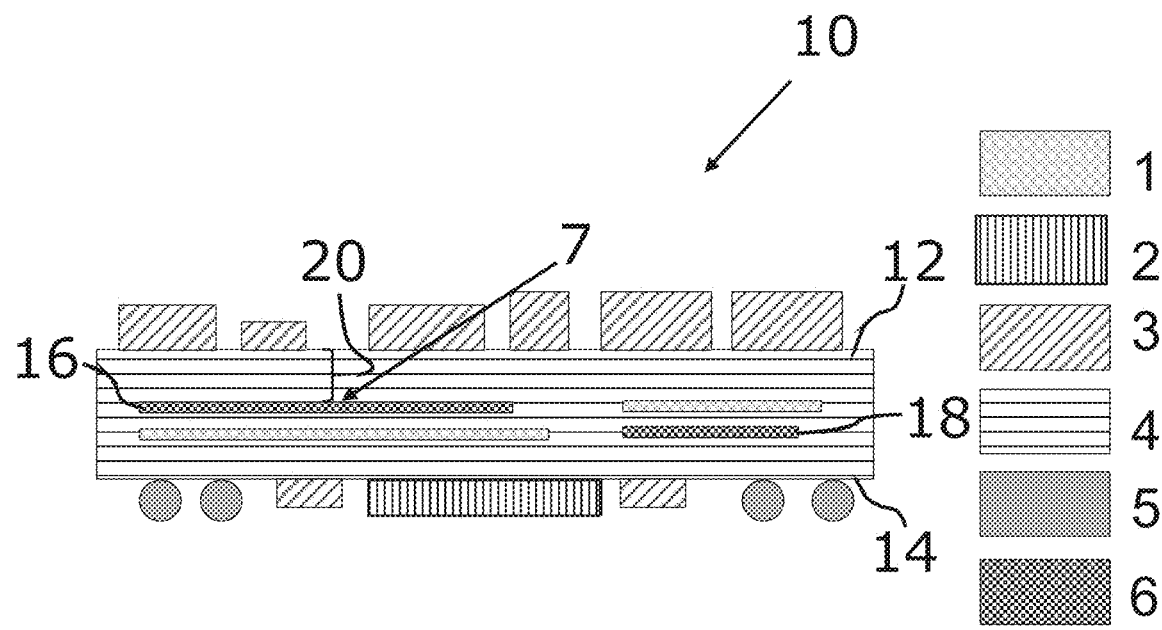
FIG. 1 is a vertical cutaway view of a PCB module in accordance with a first embodiment.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

FIG. 1 shows a cutaway of a printed circuit board (PCB) module 10 in accordance with an exemplary embodiment. The module comprises a multilayer PCB 4 having a first outer surface 12 and an opposing second outer surface 14. The cutaway in FIG. 1 is through the centre of the multilayer PCB 4, and orthogonally to the second outer surfaces 14. The PCB module 10 comprises embedded semiconductor chip or die 1,6, electronic components 3 like capacitors and resistors arranged on, and bonded to, the first outer surface 12 or the second outer surface 14 using soldering. Further, one or more semiconductors dies 2 mounted as flip chips may be arranged on the first outer surface 12 or the second outer surface 14. Electrical contacts 5 are arranged on the opposing second outer surface 14 of the multilayer PCB 4 for allowing for electrical and physical connection between the PCB module 10 and various types of external devices or components like a carrier substrate of a head-wearable hearing device.

In a first level of assembly, the PCB 4 is constructed of a plurality of layers comprising interleaved conductive and non-conductive layers. The multilayer PCB 4 shown in FIG. 1 has four embedded semiconductor dies 1,6, which are embedded during the process of building up the layers of the multilayer PCB 4. The skilled person will understand that alternative embodiments may comprise fewer or even more semiconductor dies. Each of the embedded semiconductor dies 1,6 has an active side with conductive pads for electrically connecting the semiconductor die to other parts of the PCB module 10.

To provide electrical connection to and from the embedded semiconductor dice 1,6 and to and from electronic components 3 and semiconductor dies 2 later installed on the first and second outer surface 12,14, conductive layers which comprises conductive traces such as Cu traces are interleaved with non-conductive layers made of a flexible substrate material such as polyimide. Some of the electric traces are terminated on the second outer surface 14, where they electrically connect to electrical pads or contacts 5, such as solder bumps, allowing for electrical connection between the PCB module 10 and external devices. Some of the electric traces are used to connect to the conductive pads of the embedded semiconductor dies 1,6, while some electric traces are terminated on the first or second outer surface and are used to connect components 2 and semiconductor dies 3 in a second level of assembly. During the first level of assembly the interleaved conductive and non-conductive layers are laminated or bonded together to form a coherent and unitarily formed PCB module.

The embedded semiconductor dies 1,6 shown in FIG. 1 are active components and at least one of them comprises a wireless radio-frequency transceiver. One semiconductor die 16 may comprise a Bluetooth®-compliant transceiver the other die 18 may comprise a different type of wireless radio-frequency transceiver die 18 such as a magnetoinductive transceiver for near-field magnetic based wireless transmission of various types of data signals for example audio signals. The active side of the Bluetooth®-compliant transceiver die 16 faces towards the first outer surface 12.

As illustrated in FIG. 1 the embedded radio-frequency transceiver dies 16,18 are horizontally displaced without any overlap in the vertical direction of the PCB module 10. However, in alternative embodiments of the PCB module (10), the embedded radio-frequency transceiver dies 16,18 may fully or at least partly overlap in the vertical direction.

If two semiconductor dies are arranged in the fully or at least partly overlapping manner in the vertical direction they may be placed back-to-back, i.e. with their non-active sides facing towards each other. If the embedded radio-frequency transceiver dies 16,18 are arranged or positioned in such a back-to-back fashion, it will often be advantageous to electrically shield the wireless transceivers from each other, to prevent electromagnetic interference. Therefore, the embedded semiconductor dies arranged in a back-to-back configuration may be separated by at least one intervening conductive layer or sheet such as e.g. a layer of Cu. Other embedded components may be similarly shielded from each other.

The Bluetooth®-compliant transceiver die 16 has an active side with connection pads for connecting the die 16 to the appropriate electric traces of the conductive layers of the multilayer PCB 4. On the active side of the Bluetooth®-compliant transceiver die 16 is a keep-out area 7, see also FIG. 2. A volume, bounded by the keep-out area and extending towards the first outer surface 12, must be free from any conductive materials such as Cu traces as this will disturb the emission and transmission of the wireless data signals or cause interference with other types of signals of the multilayer PCB 4 such as clock signals. Thus, a keep-out volume is bounded by a keep-out area 7 on the active side of the die 16 and further characterized by a keep-out height 20 extending from the keep-out area 7. The active side of the Bluetooth®-compliant transceiver die 16 faces towards the first outer surface 12 of the PCB 4. This allows for the keep-out volume to extend through the plurality of layers of the PCB 4, which must be kept free from electric traces within the keep-out volume.

Figure 2:
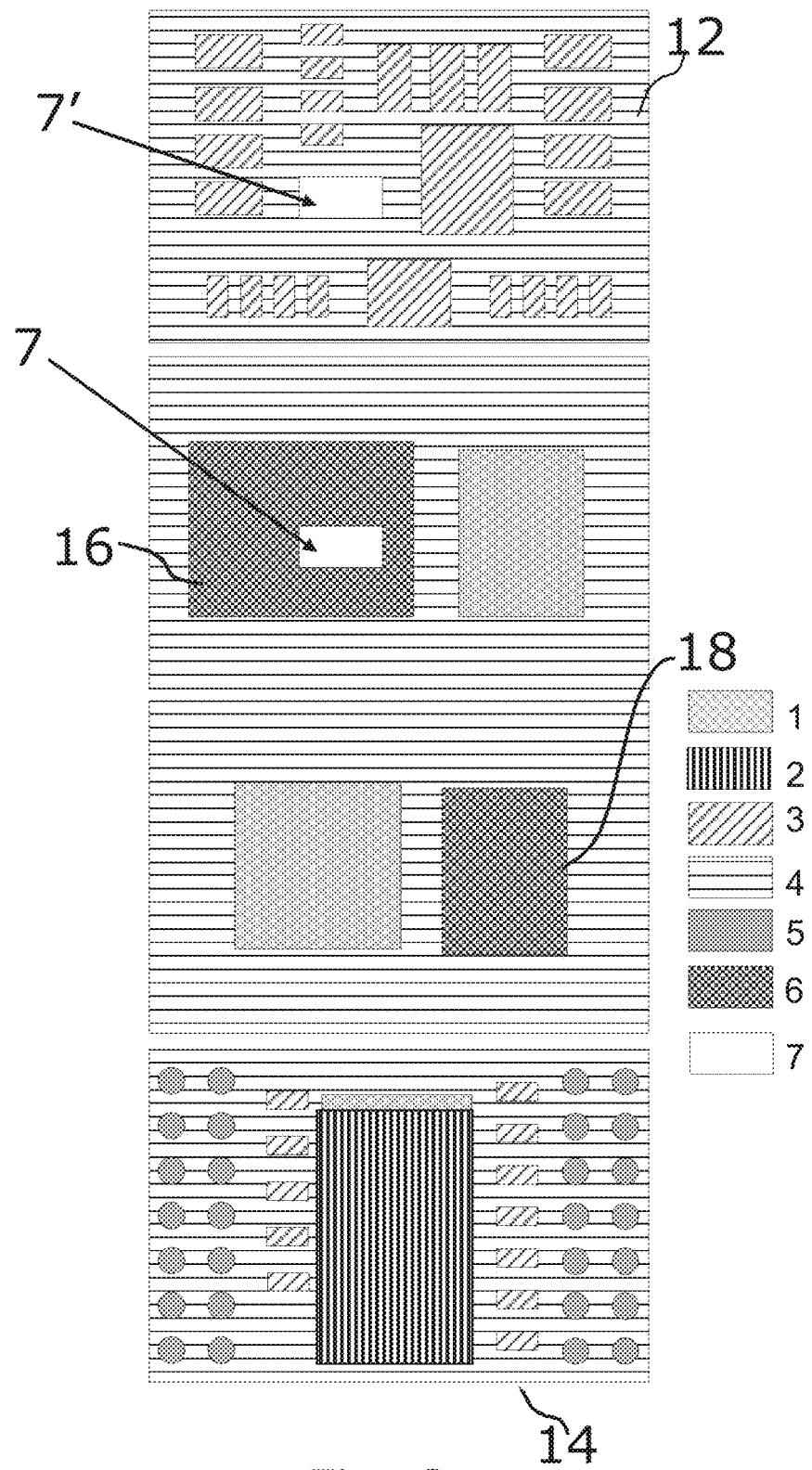
FIG. 2 shows four horizontal cutaway views at different layers of the PCB module.

In FIG. 2, the keep-out area 7 is shown as a rectangle on the active side of the Bluetooth®-compliant transceiver die 16. In the example shown in FIG. 2 the keep-out volume extends through the plurality of layers of the PCB 4 to the first outer surface 12 and the keep-out volume 7' covers part of the the first outer surface 12. In this part of the first outer surface 12, as in the rest of the keep-out volume, there should be nothing conductive present. The keep-out volume in this example may have a shape similar to a rectangular cuboid. However, the keep-out area and keep-out volume may have a variety of shapes.

As it has been generally believed that radio-frequency transceivers cannot function when embedded within a PCB 4, prototypes were made using a thinned flip chip as the embedded Bluetooth®-compliant transceiver die 16. When manufactured, the flip chip had a height of 280 microns, which was reduced to approximately 85 microns by removing part of the bulk silicon at the passive side of the semiconductor die. The thinned semiconductor Bluetooth®-compliant transceiver die 16 was embedded or interposed within the multilayer PCB structure during the first level of assembly and the connection to the Bluetooth®-compliant transceiver die 16 established during the lamination process of the PCB 4.

Figure 3:
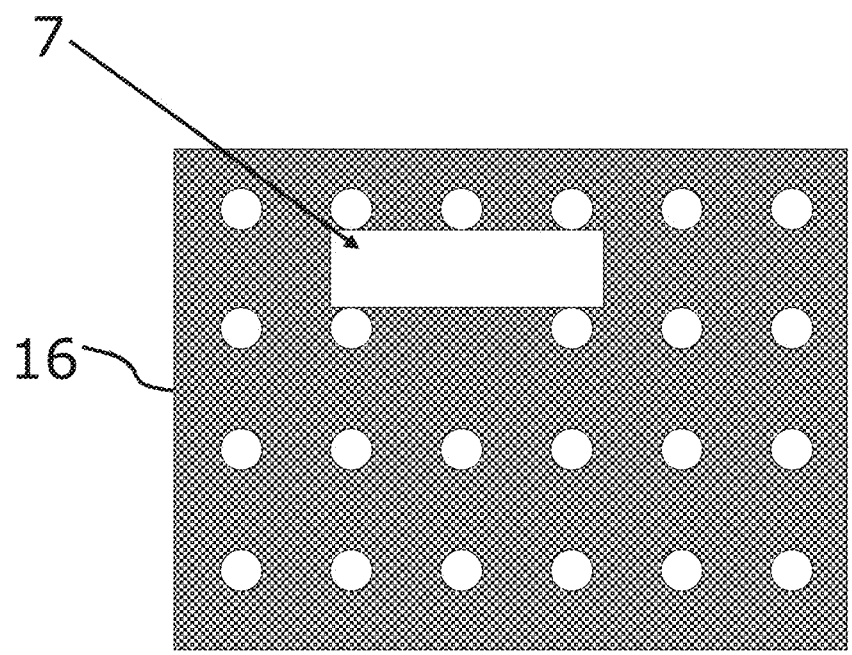
FIG. 3 shows a schematic drawing of the active side of a Bluetooth®-compliant transceiver die.

FIG. 3 shows a schematic drawing of the active side of a Bluetooth®-compliant transceiver die 16. The transceiver die 16 comprises a plurality of solder bumps, shown in FIG. 3 as white circles, and a keep-out area 7. The keep-out area 7 is shown as a rectangle in FIG. 3, but may be any suitable shape and should have an extend that is similar to, or larger than, that of the antenna coil integrated in the Bluetooth®-complient transceiver die 16. As the keep-out area 7 is necessary to reduce the likelihood of signal attenuation and/or interference of the RF signal emitted by, or received by, the antenna coil, the position of the keep-out area 7 on the Bluetooth®-compliant transceiver die 16 will be determined by the position of the antenna coil within the transceiver die 16.

Figures 4A, 4B:
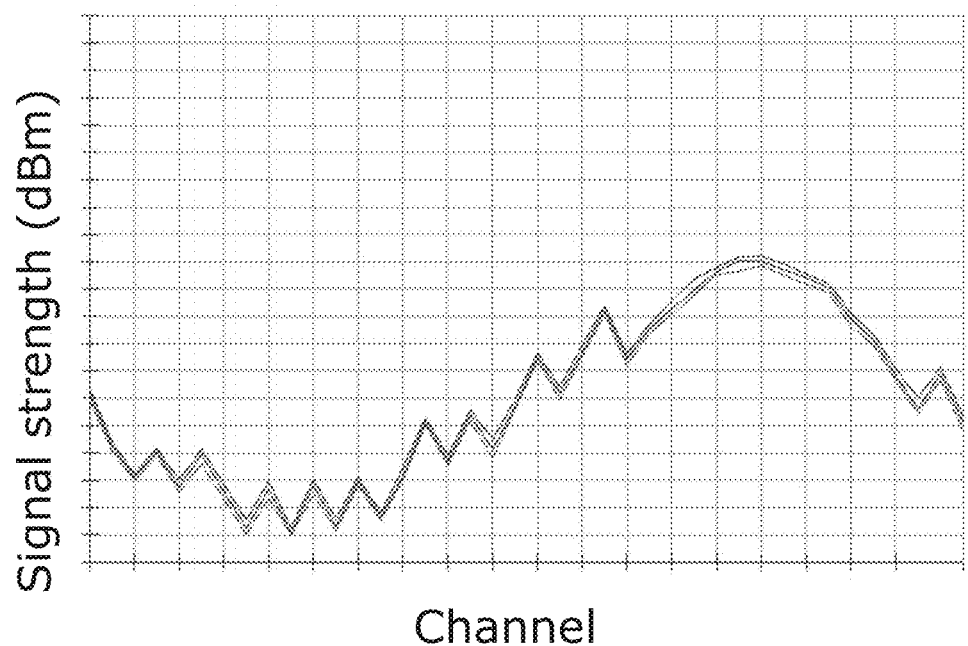
FIG. 4A shows experimental data from measurements on a Bluetooth®-compliant transceiver die embedded within the PCB module.
FIG. 4B shows experimental data from measurements on a Bluetooth®-compliant transceiver flip chip mounted on a surface of a PCB in accordance with prior art.

FIGS. 4A and 4B show experimental data from measurements of radio frequency (RF) signal strength (in dBm) versus frequency channel from a Bluetooth®-compliant transceiver dice. In FIG. 4A is shown the signal strength measured from an embedded thinned Bluetooth®-compliant transceiver die 16, which was embedded within a PCB 4 as described herein. As can be seen from FIG. 4B showing the signal from an unmodified and surface mounted Bluetooth®-compliant transceiver flip chip, the signal strength is approximately the same for every tested frequency channel for the embedded thinned semiconductor die 16 as for the unmodified flip chip. Thus, demonstrating that the wireless functionality, in particular transmitted RF level, of the Bluetooth®-compliant transceiver has not been compromised by being embedded.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

LIST OF REFERENCE NUMBERS

1 Active semiconductor dice embedded in the PCB, first level of assembly.
2 Active semiconductor dice not embedded in the PCB, second level of assembly.
3 Components not embedded in the PCB, second level of assembly.
4 Multilayer PCB.
5 Electrical connections for third level of assembly.
6 Embedded wireless radio-frequency tranceiver, 1'st level af assembly. 7 Keep-out area.
7' Keep-out volume extended to first outer surface.
10 PCB module.
12 First outer surface.
14 Second outer surface.
16 Bluetooth®-compliant transceiver die.
18 Wireless radio-frequency transceiver die.
20 Keep-out height.

The invention claimed is:
1. A printed circuit board (PCB) module comprising a multilayer PCB, the multilayer PCB comprising:

a plurality of layers, the plurality of layers comprising interleaved conductive layers and non-conductive layers;

a first outer surface and second outer surface opposite from the first outer surface;

one or more electrical components coupled to the first outer surface;

one or more electrical contacts coupled to the second outer surface; and a first embedded semiconductor die having an active side facing towards a location of the first outer surface;

wherein the first embedded semiconductor die comprises a first wireless radio-frequency transceiver; and wherein the multilayer PCB comprises a keep-out volume between the first outer surface and the active side of the first embedded semiconductor die, the keep-out volume being defined by a keep-out area of the active side of the first embedded semiconductor die and a keep-out height extending from the keep-out area towards the first outer surface, the keep-out volume being free from electrically conductive materials.

2. The printed circuit board (PCB) module according to claim 1, wherein the keep-out height is at least 100 microns (µm).

3. The printed circuit board (PCB) module according to claim 1, wherein the active side of the first embedded semiconductor die comprises an antenna coil.

4. The printed circuit board (PCB) module according to claim 1, wherein the multilayer PCB further comprises a second embedded semiconductor die having an active side facing towards the location of the first outer surface or a location of the second outer surface of the multilayer PCB, wherein the second embedded semiconductor die comprises a second wireless radio-frequency transceiver.

5. The printed circuit board (PCB) module according to claim 4, wherein the second wireless radio-frequency transceiver comprises a magnetoinductive transceiver.

6. The printed circuit board (PCB) module according to claim 1, wherein the first embedded semiconductor die has a thickness less than 200 microns.

7. The printed circuit board (PCB) module according to claim 1, wherein the active side of the first embedded semiconductor die comprises a plurality of electrical pads connected to respective electric traces in the multilayer PCB.

8. The printed circuit board (PCB) module according to claim 7, wherein the active side of the first embedded semiconductor die is electrically connected via the plurality of electronic pads and the respective electric traces to at least one of the one or more electrical components.

9. The printed circuit board (PCB) according to claim 1, wherein the one or more electrical components comprise a resistor, a capacitor, an inductor, or any combination of the foregoing.

10. The printed circuit board (PCB) according to claim 1, wherein the one or more electrical contacts comprise solder bump(s).

11. The printed circuit board (PCB) according to claim 1, wherein the wireless radio-frequency transceiver comprises a Bluetooth-compliant transceiver.

12. The printed circuit board (PCB) according to claim 1, wherein the multilayer PCB comprises a unitarily formed multilayer PCB.

13. A head-wearable hearing device configured for use in, or at, an ear of a user, the head-wearable hearing device comprising the printed circuit board (PCB) module of claim 1.

14. A printed circuit board (PCB) module comprising a multilayer PCB, the multilayer PCB comprising:

a plurality of layers, the plurality of layers comprising interleaved conductive layers and non-conductive layers;

a first outer surface and second outer surface opposite from the first outer surface;

one or more electrical components coupled to the first outer surface;

one or more electrical contacts coupled to the second outer surface; and a first embedded semiconductor die having an active side facing towards a location of the first outer surface;

wherein the first embedded semiconductor die comprises a first wireless radio-frequency transceiver;

wherein the multilayer PCB further comprises a second embedded semiconductor die having an active side facing towards the location of the first outer surface or a location of the second outer surface of the multilayer PCB, wherein the second embedded semiconductor die comprises a second wireless radio-frequency transceiver; and wherein the first embedded semiconductor die and the second embedded semiconductor die are in a back-to-back configuration separated by at least one intervening layer of the plurality of layers of the multilayer PCB.

15. The printed circuit board (PCB) module according to claim 14, wherein the multilayer PCB comprises a keep-out volume between the first outer surface and the active side of the first embedded semiconductor die, the keep-out volume being defined by a keep-out area of the active side of the first embedded semiconductor die and a keep-out height extending from the keep-out area towards the first outer surface, the keep-out volume being free from electrically conductive materials.

16. The printed circuit board (PCB) module according to claim 14, wherein the at least one intervening layer comprises at least one of the conductive layers.

\* \* \* \* \*